United States Patent [19]

Koshino et al.

[11] Patent Number: 4,984,052
[45] Date of Patent: Jan. 8, 1991

[54] BONDED SUBSTRATE OF SEMICONDUCTOR ELEMENTS HAVING A HIGH WITHSTAND VOLTAGE

[75] Inventors: Yutaka Koshino; Yoshiro Baba, both of Yokohama; Akihiko Osawa, Machida; Satoshi Yanagiya, Kawasaki, all of Japan

[73] Assignee: Kabushiki Kaisha Toshiba, Kawasaki, Japan

[21] Appl. No.: 418,587

[22] Filed: Oct. 10, 1989

[30] Foreign Application Priority Data

Oct. 13, 1988 [JP] Japan .................... 63-257681

[51] Int. Cl.⁵ ............ H01L 27/120; H01L 27/20; H01L 29/40
[52] U.S. Cl. .................... 357/49; 357/47; 357/59
[58] Field of Search ............ 357/49, 50, 48, 47, 357/59 G, 59 K, 80, 55

[56] References Cited

U.S. PATENT DOCUMENTS

| | | | |
|---|---|---|---|
| 3,990,102 | 11/1976 | Okuhara et al. | 357/49 |
| 4,131,910 | 12/1978 | Hartman et al. | 357/49 |
| 4,242,697 | 12/1980 | Berthold et al. | 357/49 |
| 4,611,386 | 9/1986 | Goto | 29/576 W |
| 4,710,794 | 12/1987 | Koshino et al. | 357/49 |
| 4,755,863 | 7/1988 | Maeda et al. | 357/49 |
| 4,792,834 | 12/1988 | Uchida | 357/23.6 |
| 4,924,284 | 5/1990 | Beyer et al. | 357/47 |

FOREIGN PATENT DOCUMENTS 0110132  6/1984  Japan ..................... 357/49

*Primary Examiner*—Rolf Hille
*Assistant Examiner*—Peter Toby Brown
*Attorney, Agent, or Firm*—Finnegan, Henderson, Farabow, Garrett, and Dunner

[57] ABSTRACT

A bonded substrate comprises a first semiconductor substrate in which a plurality of semiconductor elements are formed, a second semiconductor substrate adhered to the first semiconductor substrate so as to support it by means of an insulating layer interposed therebetween, a first semi-insulating polysilicon layer interposed between the first semiconductor substrate and the insulating layer, and a second semi-insulating polysilicon layer interposed between the insulating layer and the second semiconductor substrate. The semi-insulating polysilicon layers serve to reduce the voltage applied to the insulating layer and to prevent the insulating layer from being etched.

6 Claims, 1 Drawing Sheet

BONDED SUBSTRATE OF SEMICONDUCTOR ELEMENTS HAVING A HIGH WITHSTAND VOLTAGE

BACKGROUND OF THE INVENTION

Field of the Invention

This invention relates to a bonded substrate for isolating semiconductor elements by dielectrics in which a semiconductor element region is surrounded by dielectrics, and also to a method of manufacturing the same, and more specifically to a dielectric isolation bonded substrate for isolating semiconductor elements having a high withstand voltage of more than 500 V, and a method of manufacturing the same.

Description of the Related Art

A bonded substrate is formed by adhering semiconductor substrates which are completely different from each other. It is a new element structure which cannot be obtained by the conventional methods. FIG. 3 shows an insulating film bonded substrate of a conventional type, in which first Si substrate 10 and second Si substrate 11 are adhered to each other by $SiO_2$ 12 interposed therebetween. A trench dielectric isolating section made of $SiO_2$ 15 and polysilicon 13 is formed on the insulating film bonded substrate. Since the elements are isolated by the dielectrics, an isolation capacitance, a problem to the conventional P-N isolation, is greatly reduced.

In a semiconductor device using the conventional isolating film bonded substrate, a high voltage is applied to first Si substrate 10 in which a semiconductor element is formed, and a ground potential is applied to second Si substrate 11. Insulating film $SiO_2$ 12 interposed between substrates 10 and 11 maintains a potential difference therebetween. To impart a sufficient withstand voltage to the semiconductor element, insulating film $SiO_2$ 12 must be thick. For example, to maintain a withstand voltage of 2000 V, the $SiO_2$ film must be 5 to 10 $\mu$m thick. Such a thick $SiO_2$ film is difficult to form. Moreover, the bonded substrate for dielectric isolation using such an insulating film as $SiO_2$ 12 is electrically unstable, because an electric field may leak from one substrate into the other. Further, to remove a masking $SiO_2$ layer which has been stained during the Si RIE (Reactive Ion Etching) process, NH$_4$F etches $SiO_2$ 12 sandwiched between the substrates, as indicated by the dotted line in FIG. 3. The etched portion is not buried even by the subsequent manufacturing steps and a space remains as hollow 14, which decreases the strength of the substrate.

SUMMARY OF THE INVENTION

It is an object of the present invention to prevent an electric field from leaking from one substrate into the other through the bonding section, and to prevent the insulating layer in the bonding section from being etched. To achieve this object, a first semi-insulating polysilicon is sandwiched between the first semiconductor substrate, in which a plurality of semiconductor elements are formed, and the insulating layer of the bonding section. Also, a second semi-insulating polysilicon is sandwiched between the second semiconductor substrate and the insulating layer of the bonding section. Because of the semi-insulating polysilicon, the leakage of the electric field is prevented, the voltage applied to the insulating layer is low, and the insulating layer is not etched.

DETAILED DESCRIPTION OF THE PREFERRED EMBODIMENT

Figures 1A, 1B:
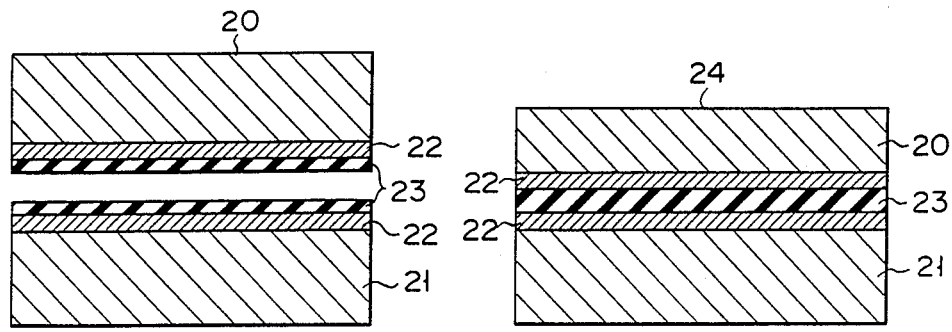
FIG. 1A and FIG. 1B are sectional views showing the steps of forming a bonded substrate of semiconductor elements having a high withstand voltage according to an embodiment of the present invention.
Figures 2A, 2B:
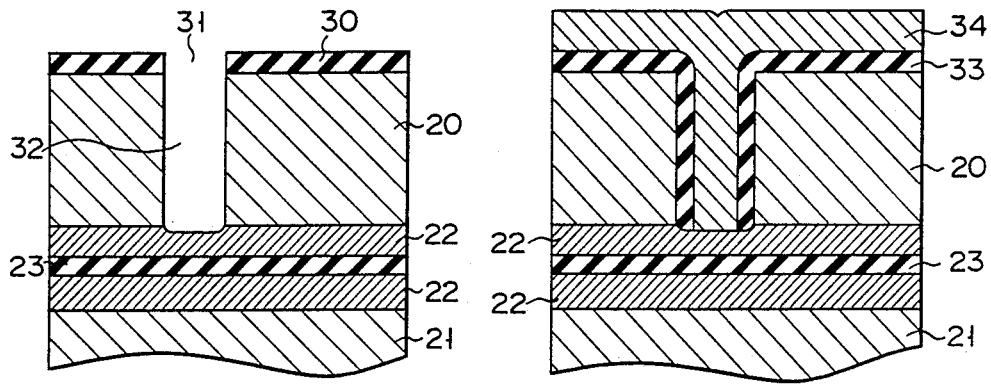
FIG. 2A and FIG. 2B are sectional views showing the steps of forming a trench dielectric isolating section according to an embodiment of the present invention.
Figure 3:
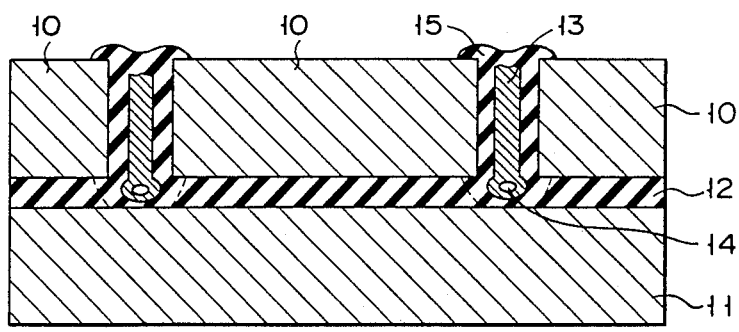
FIG. 3 is a sectional view showing the conventional bonded substrate of semiconductor elements having a high withstand voltage.

An embodiment of the present invention will be described below with reference to FIG. 1A and FIG. 1B. Semi-insulating polysilicon layers (hereinafter abbreviated to SIPOS) 22 of $1\times10^9$ to $1\times10^{11}$ $\Omega$.cm were formed on the mirror-like surfaces of first Si substrate 20 and second Si substrate 21. The thickness of layer 22 is 1 $\mu$m. SIPOS layer 22 was adhered to each of the substrates using SiH$_4$ and N$_2$O by means of thermal decomposition by the low-pressure CVD (Chemical Vapor Deposition) method. Thereafter, $SiO_2$ layer 23 of 0.5 $\mu$m was formed on each SIPOS layer 22. $SiO_2$ layer 23 is adhered to SIPOS layer 22 also using SiH$_4$ and O$_2$ by means of thermal decomposition by the low-pressure CVD method. SIPOS layer 22 and $SiO_2$ layer 23 can be formed sequentially in the same apparatus. Further, $SiO_2$ layer 23 may be formed by the atmospheric CVD method, and may contain the impurities such as boron, phosphorous, or arsenic. Next, SIPOS layer 22 adhered to first Si substrate 20 and $SiO_2$ adhered to second Si substrate 21 were pressed on each other and heated in the atmosphere of N$_2$ and O$_2$ for 30 minutes at a temperature of 1100° C., thus producing a bonded substrate for forming a semiconductor element having a high withstanding voltage. Thereafter, opening 31 for a trench was formed in $SiO_2$ 30 by the PEP (Photo Engrave Process). Then, Si substrate 20 was etched perpendicularly by the RIE method from opening 31. The etching was ceased when SIPOS film 22 appeared, and thus trench 32 was formed. At this time, since $SiO_2$ 30 of about 0.3 $\mu$m, which had been stained during the RIE process, remained on the substrate surface, it was removed by using NH$_4$F. At the same time, the stain due to the RIE method, which was adhered to the inside of trench 32, was also removed. The etching speed in SIPOS layer 22 located at the bottom of trench 32 is smaller than that in substrate 20, and SIPOS layer 22 was etched only by about 100 Å. After removing the stain, oxidation at a temperature of 1100° C. was performed, so that $SiO_2$ 33 of 0.5 $\mu$ was formed on the surface of Si substrate 20 and the side wall of trench 32, as shown in FIG. 2B. Further, polysilicon 34 of about 2 $\mu$m was adhered by the low-pressure CVD method so as to stuff the remaining trench and to flatten the substrate surface. Then, polysilicon 34 was etched by the RIE method, the CDE (Chemical Dry Etching) method, etc., until $SiO_2$ 33 appears.

Thus, a dielectric isolating region is formed, and semiconductor elements are formed in the isolated region by the conventional method.

In the above-described bonded substrate for forming a region isolating elements having a high withstand voltage, the withstand voltage across first and second Si substrates 20 and 21 was about 1500 V, and the withstand voltage across the islands formed in first Si substrate 20, isolated from each other, was about 500 V. It is evident that the difference of these withstand voltages depends on whether the insulating section includes SIPOS film 22. According to another embodiment, SIPOS film of 1 μm was formed in trench 32, then SiO$_2$ film was adhered thereto, and polysilicon was stuffed into the remaining trench 32. In this case, the withstand voltage across the isolated islands was also 1500 V.

In addition, according to the above-described embodiments, since the SIPOS film used in the bonding section is not etched easily by NH$_4$F, a hollow is not formed in the step of removing masking SiO$_2$ 30 after executing the Si RIE method. Thus, the adhesive strength of the bonded substrate of the present invention is larger than that of the conventional art.

As has been described above, according to the present invention, since the semi-insulating poly-silicon section prevents the leakage of the electric field, the voltage applied to the insulating layer is small. In addition, since the semi-insulating poly-silicon section serves to stop the etching, the insulating layer is prevented from being etched.

What is claimed is:

1. A bonded substrate of semiconductor elements having a high withstand voltage, comprising:

a first semiconductor substrate having a plurality of semiconductor elements disposed therein and thereon;

a second semiconductor substrate bonded to a rear surface of the first semiconductor substrate with a first insulating layer provided therebetween;

a first semi-insulating polysilicon layer provided between said first semiconductor substrate and said first insulating layer;

a second semi-insulating polysilicon layer provided between said second semiconductor substrate and said first insulating layer;

a trench formed in the first semiconductor substrate and extending through the first semiconductor substrate to the first semi-insulating polysilicon layer;

a second insulating layer provided on an inner wall of the trench; and a polysilicon layer provided on the second insulating layer covering the inner wall of the trench.

2. The bonded substrate according to claim 1, wherein said first and second semiconductor substrates are each formed of silicon.

3. The bonded substrate according to claim 1, wherein said insulating layer is formed of an SiO$_2$ layer.

4. The bonded substrate according to claim 1, wherein said first insulating layer is an SiO$_2$ layer containing boron as an impurity.

5. The bonded substrate according to claim 1, wherein said insulating layer is formed of a phosphorous doped SiO$_2$ layer.

6. The bonded substrate according to claim 1, wherein said insulating layer is formed of an arsenic doped SiO$_2$ layer.

* * * * *